United States Patent
Lee et al.

(10) Patent No.: US 7,377,776 B2
(45) Date of Patent: May 27, 2008

(54) SEMICONDUCTOR WAFER BAKING APPARATUS

(75) Inventors: Jin-sung Lee, Seoul (KR); Dong-woo Lee, Seoul (KR); Tae-gyu Kim, Hwaseong-si (KR); Tae-sang Park, Suwon-si (KR); Bang-weon Lee, Yongin-si (KR); Jong-kill Lim, Hwaseong-si (KR); Chang-hoon Jung, Seoul (KR); Sang-kwon Wee, Hwaseong-si (KR)

(73) Assignee: Samsung Electronics Co., Ltd., Suwon (KR)

( * ) Notice: Subject to any disclaimer, the term of this patent is extended or adjusted under 35 U.S.C. 154(b) by 198 days.

(21) Appl. No.: 11/318,539

(22) Filed: Dec. 28, 2005

(65) Prior Publication Data
US 2006/0151462 A1    Jul. 13, 2006

(30) Foreign Application Priority Data
Dec. 30, 2004    (KR) ..................... 10-2004-0117014

(51) Int. Cl.
H05B 3/68    (2006.01)

(52) U.S. Cl. ..................... 432/258; 219/443.1; 118/725

(58) Field of Classification Search ................ 432/253, 432/258, 247; 219/443.1, 449.1; 118/725, 118/729
See application file for complete search history.

(56) References Cited

U.S. PATENT DOCUMENTS

| | | | |
|---|---|---|---|
| 5,588,827 A * | 12/1996 | Muka ............................. | 432/5 |
| 6,416,318 B1 * | 7/2002 | Lee et al. .................... | 432/247 |
| 6,590,186 B2 * | 7/2003 | Tanaka et al. .............. | 219/390 |
| 6,884,066 B2 * | 4/2005 | Nguyen et al. ............. | 432/250 |
| 6,921,436 B2 * | 7/2005 | Ueda .......................... | 118/666 |
| 7,156,924 B2 * | 1/2007 | Renken ....................... | 118/725 |

* cited by examiner

*Primary Examiner*—Gregory Wilson
(74) *Attorney, Agent, or Firm*—Sughrue Mion, PLLC

(57) ABSTRACT

A semiconductor wafer baking apparatus includes a hot plate, a container of which an upper part is open, and a cover that covers the upper part of the container. The cover includes an upper plate, a lower plate and a side wall that form a gas circulating space therebetween. At least one gas inlet is formed in the side wall, a plurality of gas supply holes are formed in a central region of the lower plate, and a skirt on which is formed a gas exhaust unit is coupled to a lower edge of the cover.

4 Claims, 4 Drawing Sheets

SEMICONDUCTOR WAFER BAKING APPARATUS

CROSS-REFERENCE TO RELATED PATENT APPLICATIONS

This application claims priority from Korean Patent Application No. 10-2004-0117014, filed on Dec. 30, 2004, in the Korean Intellectual Property Office, the disclosure of which is incorporated herein in its entirety by reference.

BACKGROUND OF THE INVENTION

1. Field of the Invention

The present invention relates to a semiconductor wafer baking apparatus and, more particularly, to a semiconductor wafer baking apparatus that can maintain uniform temperature over a semiconductor wafer and can improve a purging efficiency during baking.

2. Description of the Related Art

Generally, semiconductor devices are manufactured through processes of ion implanting, thin film deposition, diffusion, photolithography, and etching. Among these processes, photolithography is an essential part of semiconductor manufacture, allowing a desired pattern to be formed. Photolithography involves transferring a pattern from a photo mask to a photo resist (PR) coated on a substrate, using an exposure system, and etching a predetermined pattern into a material film below using the photo resist as an etch mask. In this case, the photo resist is a photo sensitive resin, and the major components of the photo resist are polymer, a solvent, and a sensitizer.

The photolithography process includes a baking process, where the substrate is heated before or after coating with the photo resist. In the baking process, an organic solvent is removed from the photo resist in the form of fumes.

The baking process generally includes four steps. The first is a pre-baking step, in which organic materials or moisture are removed from the surface of the substrate by heating the substrate before coating the photo resist onto the substrate. The second is a soft baking, immediately after coating the photo resist onto the substrate. The third is a post exposure baking, after exposing the photo resist. The last is a hard baking, after developing the photo resist.

An apparatus for performing the baking process generally includes a hot plate that heats a wafer coated with photo resist, and a chamber in which the hot plate is mounted. A purging gas, such as $N_2$ gas, for exhausting fumes from the photo resist during baking, is supplied to the chamber. At this time, the purging gas is one of the factors that causes a temperature gradient in the chamber, which affects the critical dimensions of the semiconductor devices integrated on the wafer. The thermal stability of the baking apparatus is a factor in the baking process, so it is desirable to heat the wafer uniformly.

Therefore, there is a need to develop a baking apparatus that can minimize the effect of the purging gas on a wafer, and can exhaust fumes from the photo resist during baking.

SUMMARY OF THE INVENTION

The present invention provides a semiconductor wafer baking apparatus that can maintain a uniform temperature over a semiconductor wafer and improve the purging efficiency during baking.

According to an aspect of the present invention, there is provided a semiconductor wafer baking apparatus comprising: a hot plate; a container of which an upper part is open; and a cover that covers the upper part of the container, wherein the cover includes an upper plate, a lower plate and a side wall that form a gas circulating space therebetween, at least one gas inlet is formed in the side wall, a plurality of gas supply holes are formed in a central region of the lower plate, and a skirt on which is formed a gas exhaust unit is coupled to a lower edge of the cover.

The skirt may include multiple folds of side wall members, and at least one exhaust hole is formed in each of the side wall members.

The apparatus can further comprise a gas diffusion plate, in which a plurality of gas diffusion holes are formed, between the lower plate and the hot plate, wherein the gas diffusion plate uniformly distributes a purging gas supplied through the gas supply holes of the lower plate over the hot plate.

BRIEF DESCRIPTION OF THE DRAWINGS

The above and other features and advantages of the present invention will become more apparent by describing in detail exemplary embodiments thereof with reference to the attached drawings, in which.

DETAILED DESCRIPTION OF ILLUSTRATIVE, NON-LIMITING EMBODIMENTS OF THE INVENTION

The present invention will now be described more fully with reference to the accompanying drawings in which exemplary embodiments of the invention are shown.

Figure 1:
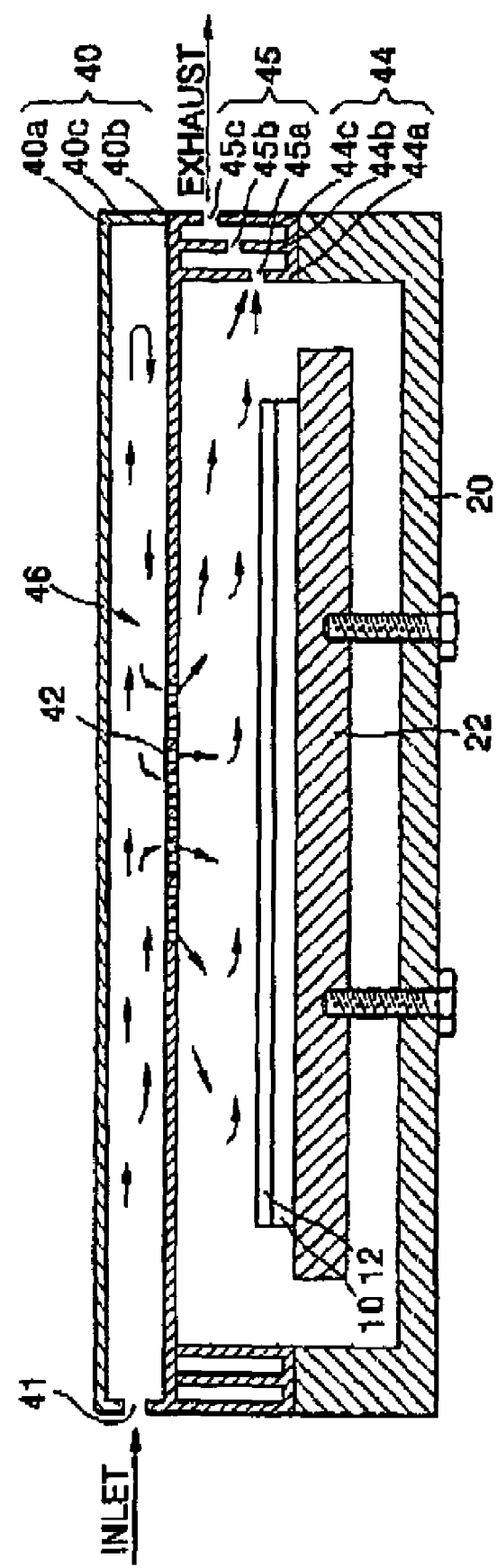
FIG. 1 is a cross-sectional view of a semiconductor wafer baking apparatus according to a first embodiment of the present invention.
Figure 2:
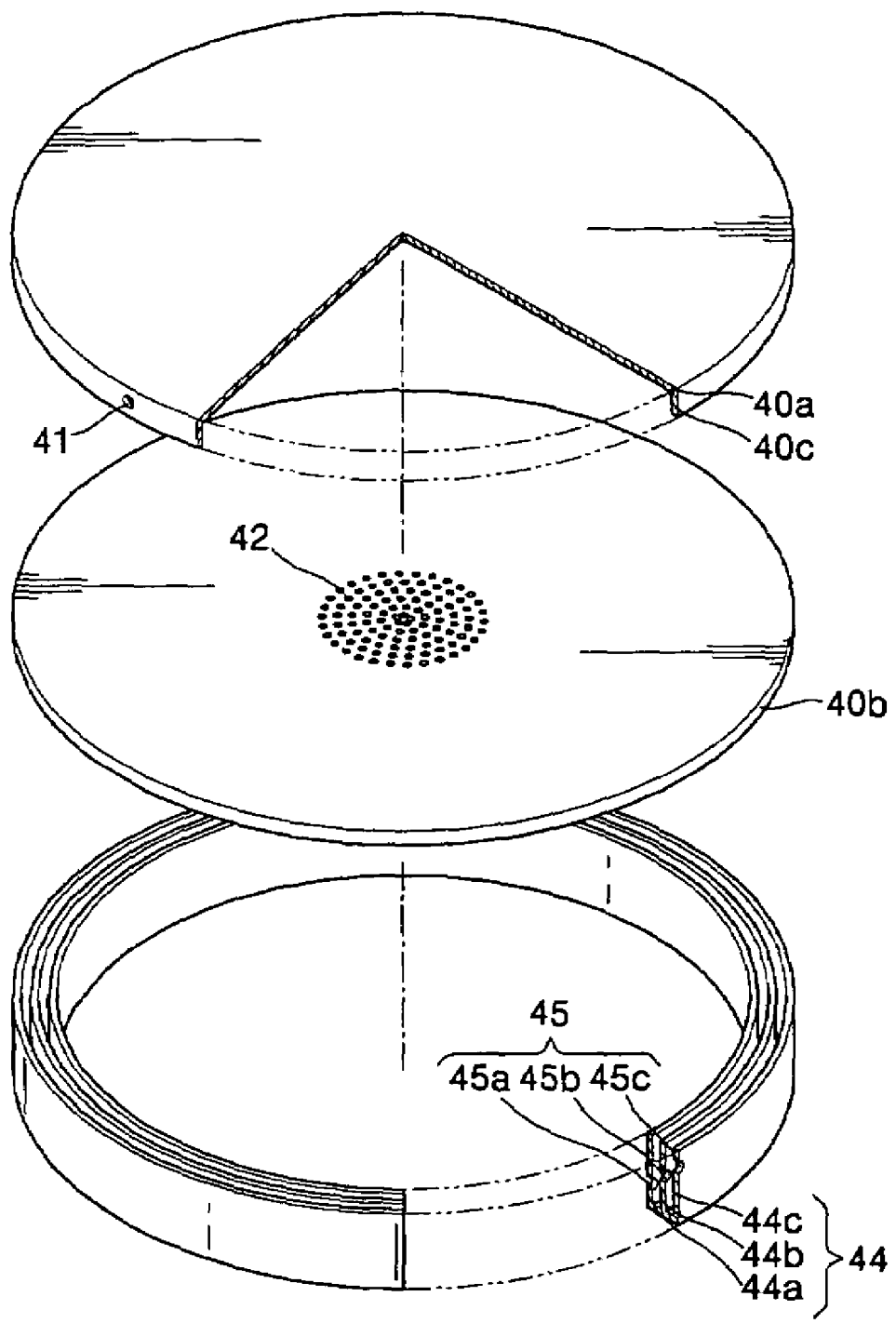
FIG. 2 is an exploded perspective view of the cover of FIG. 1.

FIG. 1 is a cross-sectional view of a semiconductor wafer baking apparatus according to a first embodiment of the present invention, and FIG. 2 is an exploded perspective view of the cover of FIG. 1.

Referring to FIGS. 1 and 2, a semiconductor wafer baking apparatus comprises a hot plate 22, a container 20 of which an upper part is open, a cover 40 that covers the upper part of the container 20, and a skirt 44 coupled to a lower part of the cover 40.

A wafer 10 coated with a photo resist 12 is placed on the hot plate 22 and heated to a predetermined temperature.

The upper part of the container 20 is open, and the hot plate 22 is placed in the container 20.

The cover 40 includes an upper plate 40a and a lower plate 40b separated by a side wall 40c. At least one gas inlet 41 is formed in the side wall 40c, and a plurality of gas supply holes 42 are formed in the central region of the lower plate 40b. The cover 40 has a gas circulating space 46 between the upper plate 40a and the lower plate 40b. A purging gas, such as $N_2$, is supplied through the gas inlet 41 and preheated while passing through the gas circulating space 46 between the upper plate 40a and the lower plate 40b, before passing through the gas supply holes 42 in the lower plate 40b and entering the space above the hot plate 22.

Also, a skirt 44 is coupled to the lower edge of the cover 40, and a gas exhaust unit 45 is formed in the skirt 44. The gas exhaust unit 45 is a path through which the purging gas and fumes in the container 20 are discharged to the outside. The skirt 44 can include multiple folds of side wall members 44*a*, 44*b*, and 44*c*, and at least one gas exhaust hole 45*a*, 45*b*, and 45*c* can be formed in each side wall member 44*a*, 44*b*, and 44*c*.

The purging gas and fumes are discharged slowly, since the skirt 44 is composed of multiple folds of the side walls. Therefore, the swirling of purging gas can be reduced, since the purging gas flows at a uniform low speed over the surface of the wafer 10.

According to the present invention, the temperature gradient on the surface of the wafer is minimized, since the purging gas is uniformly distributed over the entire surface of the wafer. Also, the swirling of the purging gas is reduced and a stable discharge of exhaust gas is achieved, since the purging gas flows at a uniform low speed over the entire surface of the wafer.

Also, the purging gas is preheated in the gas circulating space 46 between the upper plate 40*a* and the lower plate 40*b*, and a uniform temperature is maintained over the entire surface of the wafer even though the purging gas enters. In an experiment, the maximum temperature deviation over the surface of a wafer in a baking apparatus having a purging diameter of 300 mm was 0.1° C., which shows a very stable thermal state. The use of the wafer baking apparatus according to the present invention can maintain a uniform temperature over the surface of a wafer, and can improve the purging efficiency of a purging gas since the effect of the purging gas on the wafer is minimized.

Figure 3:
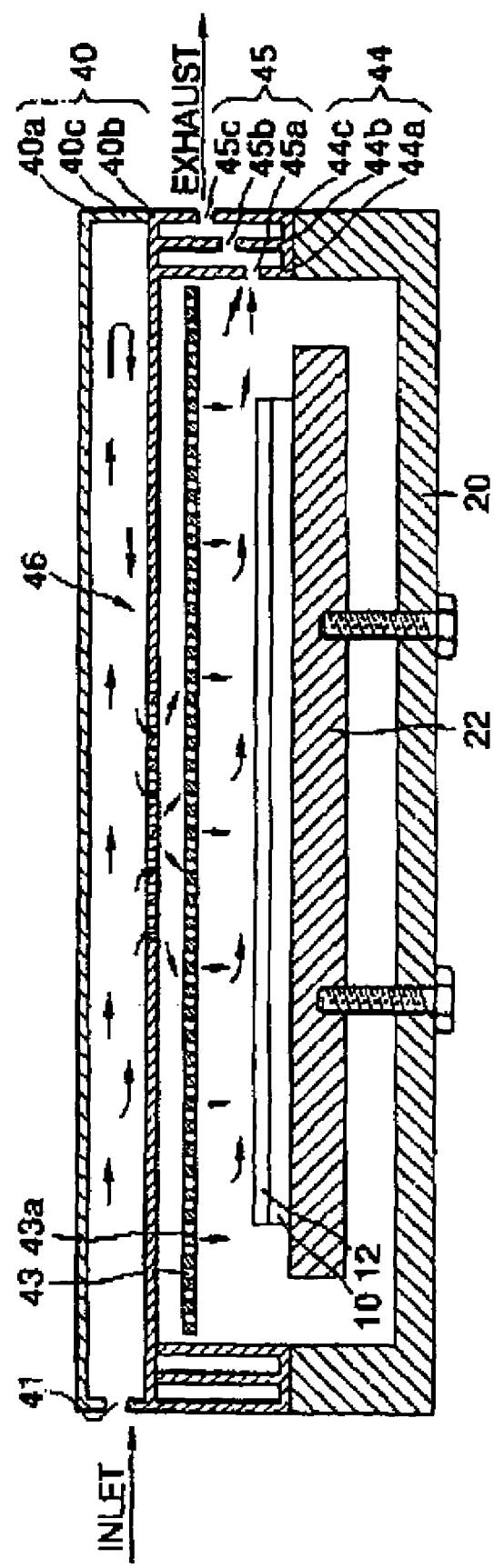
FIG. 3 is a cross-sectional view of a semiconductor wafer baking apparatus according to a second embodiment of the present invention.
Figure 4:
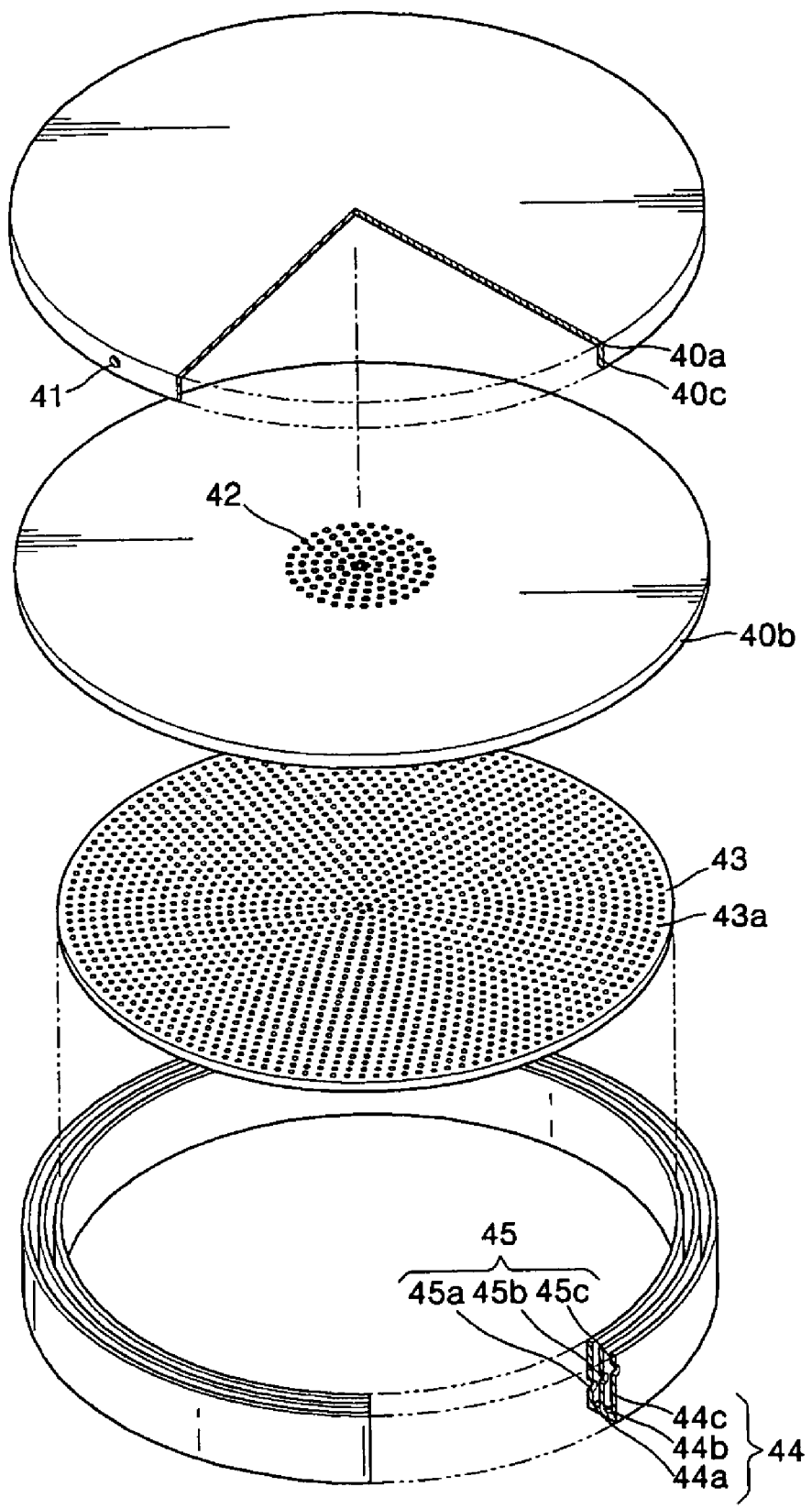
FIG. 4 is an exploded perspective view of the cover of FIG. 3.

FIG. 3 is a cross-sectional view of a semiconductor wafer baking apparatus according to a second embodiment of the present invention, and FIG. 4 is an exploded perspective view of the cover of FIG. 3. Like reference numerals refer to like elements throughout the drawings, and their description is not repeated.

Referring to FIGS. 3 and 4, a semiconductor wafer baking apparatus according to the second embodiment has the same components as in the first embodiment, but in the second embodiment a gas diffusion plate 43 is further included between the lower plate 40*b* and the hot plate 22. A purging gas supplied through the gas supply holes 42 of the lower plate 40*b* can be uniformly distributed over a wafer 10, since a plurality of gas diffusion holes 43*a* are formed on the gas diffusion plate 43. Accordingly, the purging gas can be uniformly distributed over the entire surface of the wafer 10 placed on the hot plate 22 while purging, thereby reducing the temperature gradient over the surface of the wafer 10.

According to the present invention, the temperature gradient over the surface of the wafer is minimized, since the purging gas is uniformly distributed over the entire surface of the wafer. Also, the swirling of the purging gas is reduced and a stable discharge of exhaust gas is achieved, since the purging gas flows at a uniform low speed over the entire surface of the wafer.

Also, the purging gas is preheated in the gas circulating space 46 between the upper plate 40*a* and the lower plate 40*b*, and a uniform temperature is maintained over the entire surface of the wafer even though the purging gas enters. In an experiment, the maximum temperature deviation over the surface of a wafer in a baking apparatus having a purging diameter of 300 mm was 0.1° C., which shows a very stable thermal state. Therefore, the temperature gradient over the wafer 10 while baking is small, and the temperature of the wafer 10 is readily controlled.

Also, according to the present invention, fumes generated from photo resist 12 coated on the wafer 10 can be readily exhausted to the outside through the gas exhaust unit 45 of the skirt 44 coupled to the cover 40. Therefore, the residual particles of the fumes do not affect the wafer 10.

The use of the wafer baking apparatus according to the present invention can maintain a uniform temperature over the surface of a wafer, and can improve the purging efficiency of a purging gas since the effect of the purging gas on the wafer is minimized.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor wafer baking apparatus comprising:
   a hot plate;
   a container of which an upper part is open; and
   a cover that covers the upper part of the container,
   wherein the cover includes an upper plate, a lower plate and a side wall that form a gas circulating space therebetween;
   at least one gas inlet is formed in the side wall;
   a plurality of gas supply holes are formed in a central region of the lower plate; and
   a skirt on which is formed a gas exhaust unit is coupled to a lower edge of the cover.

2. The apparatus of claim 1, wherein the skirt includes multiple folds of side wall members.

3. The apparatus of claim 2, wherein at least one exhaust hole is formed in each of the side wall members.

4. The apparatus of claim 1 further comprising a gas diffusion plate, in which a plurality of gas diffusion holes are formed, between the lower plate and the hot plate, wherein the gas diffusion plate uniformly distributes a purging gas supplied through the gas supply holes of the lower plate over the hot plate.

* * * * *